United States Patent
Chang et al.

(10) Patent No.: US 8,822,038 B2
(45) Date of Patent: Sep. 2, 2014

(54) COATED ARTICLE AND METHOD FOR MANUFACTURING COATED ARTICLE

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Shun-Mao Lin, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 396 days.

(21) Appl. No.: 13/169,744

(22) Filed: Jun. 27, 2011

(65) Prior Publication Data
US 2012/0171515 A1   Jul. 5, 2012

(30) Foreign Application Priority Data
Dec. 30, 2010   (CN) .......................... 2010 1 0616255

(51) Int. Cl.
*B32B 15/01*   (2006.01)
*C23C 4/08*   (2006.01)
*C23C 14/35*   (2006.01)

(52) U.S. Cl.
USPC ............................ 428/660; 428/656; 428/674

(58) Field of Classification Search
USPC .......................... 428/655–660; 427/453–456; 204/298.02–298.22
See application file for complete search history.

(56) References Cited

U.S. PATENT DOCUMENTS

| | | | | |
|---|---|---|---|---|
| 2002/0192494 | A1* | 12/2002 | Tzatzov et al. | 428/655 |
| 2005/0011936 | A1* | 1/2005 | Raybould et al. | 228/245 |
| 2008/0226819 | A1* | 9/2008 | Kutilek et al. | 427/250 |
| 2009/0075114 | A1* | 3/2009 | Hovsepian et al. | 428/650 |
| 2012/0028012 | A1* | 2/2012 | Nicholls et al. | 428/213 |

OTHER PUBLICATIONS

Petrov et al., J. Vac. Sci. Technol. A 11, 2733 (1993).*
Schwartz, Brazing, Sep. 2003, ASM International, 2nd Ed., p. 191.*

* cited by examiner

*Primary Examiner* — Gwendolyn Blackwell
*Assistant Examiner* — Lucas Wang
(74) *Attorney, Agent, or Firm* — Novak Druce Connolly Bove + Quigg LLP

(57) ABSTRACT

An coated article includes a substrate; and a coating deposited on the substrate, wherein the coating is a titanium layer mixed with a first element and a second element, M is at least one element selected from a group consisting of iron, cobalt, nickel, copper, niobium, hafnium and tantalum; R is at least one element selected from a group consisting of scandium, yttrium and lanthanide.

2 Claims, 2 Drawing Sheets

COATED ARTICLE AND METHOD FOR MANUFACTURING COATED ARTICLE

CROSS-REFERENCE TO RELATED APPLICATIONS

The present application is related to co-pending U.S. patent applications, each entitled "COATED ARTICLE AND METHOD FOR MANUFACTURING COATED ARTICLE", by Zhang et al. These applications have the same assignee as the present application and have been concurrently filed herewith. The above-identified applications are incorporated herein by reference.

BACKGROUND

1. Technical Field

The exemplary disclosure generally relates to coated articles and a method for manufacturing the coated articles.

2. Description of Related Art

Vacuum deposition is typically used to form a thin film or coating on housings of electronic devices, to provide an attractive metallic appearance on the housing. However, typically films or coatings deposited by vacuum deposition have a low corrosion resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
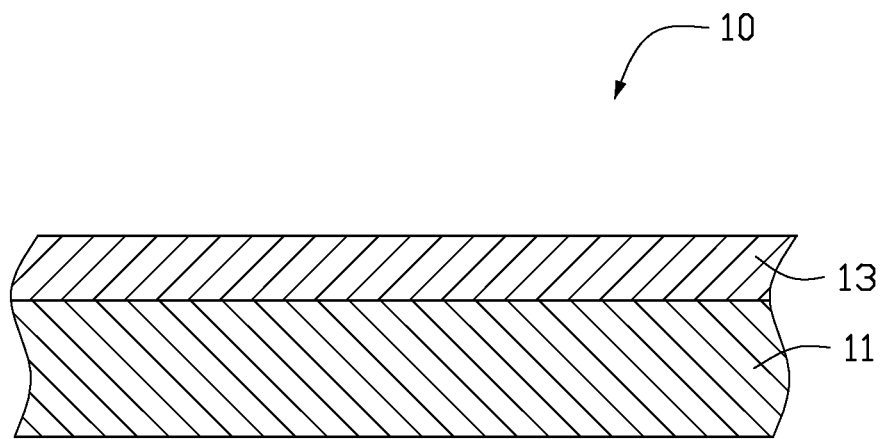
FIG. 1 is a cross-sectional view of an exemplary embodiment of a coated article.

Referring to FIG. 1, an exemplary embodiment of a coated article 10 includes a substrate 11 and a coating 13 deposited on the substrate 11. The substrate 11 may be made of stainless steel, aluminum alloy, magnesium alloy, glass or ceramics. The coating 13 is a titanium layer co-doped with M and R, wherein M may be at least one element selected from a group consisting of iron, cobalt, nickel, copper, niobium, hafnium and tantalum. R may be at least one element selected from a group consisting of scandium, yttrium and lanthanide. The content of M in the coating is between about 10 wt % and about 49.5 wt % of the total weight of titanium, M, R. The content of R in the coating is between about 0.5 wt % and about 10 wt % of the total weight of titanium, M, R. The remainder is titanium. The coating has a thickness between about 500 nanometers and about 800 nanometers. The coating may be deposited by magnetron sputtering process.

Figure 2:
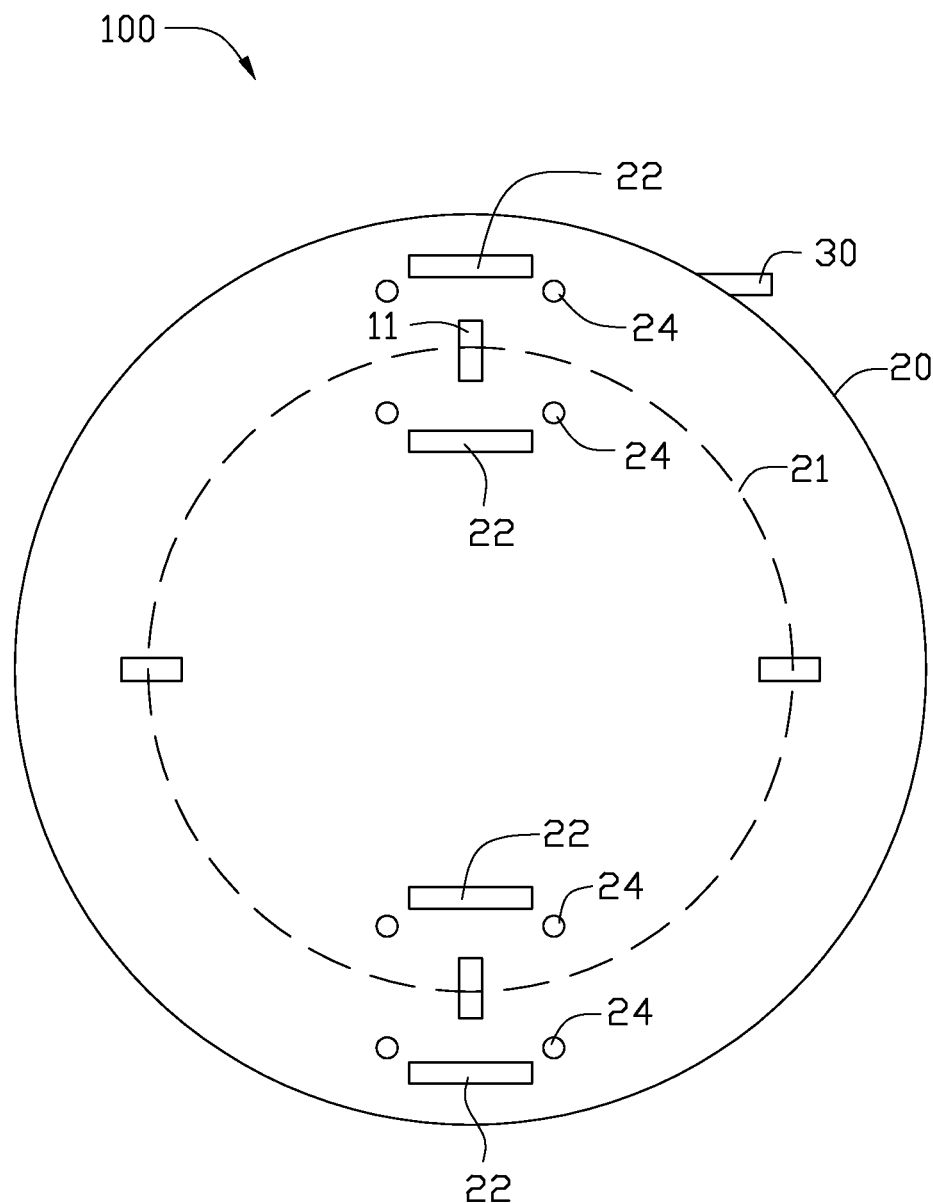
FIG. 2 is a schematic view of a magnetron sputtering coating machine for manufacturing the coated article in FIG. 1.

Referring to FIG. 2, a method for manufacturing the coated article 10 may include at least the following steps.

Providing a substrate 11. The substrate 11 may be made of stainless steel, aluminum alloy, magnesium alloy, glass or ceramics.

Pretreating the substrate 11, by washing it with a solution (e.g., Alcohol or Acetone) in an ultrasonic cleaner, to remove impurities and contaminations, such as grease, or dirt. The substrate 11 is then dried.

Providing a vacuum sputtering coating machine 100. The vacuum sputtering coating machine 100 includes a sputtering coating chamber 20 and a vacuum pump 30 connecting to the sputtering coating chamber 20. The vacuum pump 30 evacuates the air out the sputtering coating chamber 20. The vacuum sputtering coating machine 100 further includes a rotating bracket 21, a plurality of (e.g., four) targets 22 and a plurality of gas inlets 24. The rotating bracket 21 rotates the substrate 11 in the sputtering coating chamber 20 relative to the targets 22. The targets 22 face each other, and are respectively located on opposite sides of the rotating bracket 21. The targets 22 are manufactured by power metallurgy. Each target 22 is an alloy containing titanium, M and R.

The substrate 11 is then cleaned by argon plasma cleaning. The substrate 11 is retained on the rotating bracket 21. The vacuum level of the sputtering coating chamber 20 is adjusted to $3.0 \times 10^{-5}$ Torricelli (Torr). Pure argon is fed into the sputtering coating chamber 20 at a flux of about 200 Standard Cubic Centimeters per Minute (sccm) to about 400 sccm from the gas inlets 24, and a bias voltage is applied to the substrate 11 in a range of about −200 to about −300 volts from about 10 to about 20 minutes. So the substrate 11 is washed by argon plasma, to further remove the grease or dirt. Thus, a binding force between the substrate 11 and the coating 13 is enhanced.

A coating 13 is deposited on the substrate 11 inside the sputtering coating chamber 20. The temperature in the sputtering coating chamber 20 is set between about 100 degree Celsius (° C.) and about 200° C. Argon is fed into the sputtering coating chamber 20 at a flux between about 100 sccm and about 400 sccm from the gas inlets 24. The targets 22 in the sputtering coating chamber 20 are evaporated at a power between about 5 kW and about 15 kW. A bias voltage applied to the substrate 11 may be between about −50 volts and about −200 volts with a duty cycle of 50%, from between about 20 minutes to about 90 minutes, to deposit the coating 13 on the substrate 11.

EXAMPLES

Experimental examples made according to the present disclosure follow.

Example 1

The substrate 11 is made of 304 stainless steel. Each target 22 is an alloy containing titanium, copper and yttrium. The content of the copper in each target 22 is about 45 wt % of the total weight of titanium, copper and yttrium. The content of the yttrium in each target 22 is about 8 wt % of the total weight of titanium, copper and yttrium. The remainder is titanium. The temperature in the sputtering coating chamber 20 is set at about 100° C. Argon is fed into the sputtering coating chamber 20 at a flux of 100 sccm from the gas inlets 24. The targets 22 in the sputtering coating chamber 20 are evaporated at a power of about 8 kW. A bias voltage applied to the substrate 11 of about −150 volts with a duty cycle of 50%, for about 20 minutes, to deposit the coating 13 on the substrate 11. In this exemplary embodiment, the content of the copper in the coating 13 is about 45 wt %, and the content of the yttrium in coating 13 is about 8 wt %.

Example 2

The substrate 11 is made of 6063 aluminum alloy. Each target 22 is an alloy containing titanium, cobalt and cerium.

The content of the cobalt in each target 22 is about 10 wt % of the total weight of titanium, cobalt and cerium. The content of the cerium in each target 22 is about 0.5 wt % of the total weight of titanium, cobalt and cerium. The remainder is titanium. The temperature in the sputtering coating chamber 20 is set at about 200° C. Argon is fed into the sputtering coating chamber 20 at a flux of 250 sccm from the gas inlets 24. The targets 22 in the sputtering coating chamber 20 are evaporated at a power about 15 kW. A bias voltage applied to the substrate 11 of about −200 volts with a duty cycle of 50%, for about 60 minutes, to deposit the coating 13 on the substrate 11. In this exemplary embodiment, the content of the cobalt in the coating 13 is about 10 wt %, and the content of the cerium in the coating 13 is about 0.5 wt %.

Example 3

The substrate 11 is made of silicate glass. Each target 22 is an alloy containing titanium, nickel and scandium. The content of the nickel in each target 22 is about 49.5 wt % of the total weight of titanium, nickel and scandium. The content of the scandium in each target 22 is about 1 wt % of the total weight of titanium, nickel and scandium. The remainder is titanium. The temperature in the sputtering coating chamber 20 is set at about 100° C. Argon is fed into the sputtering coating chamber 20 at a flux of 400 sccm from the gas inlets 24. The targets 22 in the sputtering coating chamber 20 are evaporated at a power of about 5 kW. A bias voltage applied to the substrate 11 of about −50 volts with a duty cycle of 50%, for about 90 minutes, to deposit the coating 13 on the substrate 11. In this exemplary embodiment, the content of the nickel in the coating 13 is about 49.5 wt %, and the content of the scandium in the coating 13 is about 1 wt %.

Example Results

Each coated article was testing by separately putting it into a testing box, and applying 5 wt % of NaCl vapor fed into the testing box to test the coated article 10. The coated article 10 did not corrode after about 72 hours.

The corrosion resistance of the example coated article 10 is tested by a ®5700 linear abrader with a force of 1 kg, a rubbing length of 2 inches and 25 circles per minute. After testing, the substrate was not exposed (i.e., the chromium and silicon nitride layers remained fully intact). Thus, it is clear that the coated article 10 manufactured by the above methods has a good corrosion resistance.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate; and
   a coating deposited on the substrate, wherein the deposited coating consists of titanium metal, copper and R, wherein R is at least one element selected from a group consisting of scandium, yttrium and lanthanide;
   wherein the content of copper in the coating is between about 10 wt % and 49.5 wt %, and the content of R in the coating is between about 0.5 wt % and 10 wt %.

2. A coated article, comprising:
   a substrate; and
   a coating deposited on the substrate, wherein the deposited coating consists of titanium metal, copper and R, wherein R is at least one element selected from a group consisting of scandium, yttrium and lanthanide;
   wherein the R is yttrium; the content of copper in the coating is about 45 wt %, and the content of yttrium in the coating is about 8 wt %.

* * * * *